(12) United States Patent
Iannotti et al.

(10) Patent No.: US 8,198,895 B2
(45) Date of Patent: Jun. 12, 2012

(54) SYSTEM AND METHOD FOR MAGNETIC RESONANCE COIL ACTUATION

(75) Inventors: Joseph Alfred Iannotti, Glenville, NY (US); William Edward Burdick, Jr., Niskayuna, NY (US); Maxine M. Gibeau, Slingerlands, NY (US)

(73) Assignee: General Electric Company, Niskayuna, NY (US)

( * ) Notice: Subject to any disclaimer, the term of this patent is extended or adjusted under 35 U.S.C. 154(b) by 290 days.

(21) Appl. No.: 12/565,236

(22) Filed: Sep. 23, 2009

(65) Prior Publication Data
US 2011/0068792 A1    Mar. 24, 2011

(51) Int. Cl.
G01V 3/00 (2006.01)
(52) U.S. Cl. .......................... 324/318; 324/322
(58) Field of Classification Search .......... 324/300–322; 600/407–445
See application file for complete search history.

(56) References Cited

U.S. PATENT DOCUMENTS

| 4,763,076 | A | 8/1988 | Arakawa et al. | |
| 5,659,195 | A * | 8/1997 | Kaiser et al. | 257/415 |
| 6,032,063 | A | 2/2000 | Hoar et al. | |
| 6,496,714 | B1 * | 12/2002 | Weiss et al. | 600/423 |
| 6,542,768 | B1 | 4/2003 | Kuth et al. | |
| 6,673,698 | B1 | 1/2004 | Lin et al. | |
| 6,710,597 | B2 | 3/2004 | Reykowski et al. | |
| 7,262,075 | B2 | 8/2007 | Aggarwal et al. | |
| 7,375,414 | B2 * | 5/2008 | Forbes et al. | 257/662 |
| 7,554,326 | B2 * | 6/2009 | Sakakura | 324/318 |
| 7,800,368 | B2 * | 9/2010 | Vaughan et al. | 324/318 |
| 2005/0162165 | A1 | 7/2005 | Nistler et al. | |
| 2008/0051854 | A1 | 2/2008 | Bulkes et al. | |
| 2009/0143651 | A1 * | 6/2009 | Kallback et al. | 600/301 |
| 2009/0163980 | A1 * | 6/2009 | Stevenson | 607/63 |
| 2011/0147715 | A1 * | 6/2011 | Rogers et al. | 257/24 |
| 2011/0207328 | A1 * | 8/2011 | Speakman | 438/694 |

FOREIGN PATENT DOCUMENTS

| DE | 19922999 A1 | 11/2000 |
| WO | 2007133302 A2 | 11/2007 |
| WO | 2009008842 A1 | 1/2009 |

OTHER PUBLICATIONS

Data Sheet for the C10001xxxT Series of Carbon Nonwovens, Marktek Inc.
112-48 Conductive Ink, Creative Materials, Inc., 1992.

(Continued)

Primary Examiner — Brij Shrivastav
(74) Attorney, Agent, or Firm — Scott J. Asmus

(57) ABSTRACT

An apparatus includes a plurality of magnetic resonance (MR) coil elements and a plurality of voltage-actuated switches coupled to the plurality of MR coil elements, each voltage-actuated switch configured to selectively activate a respective MR coil element. The apparatus also includes a voltage source configured to supply a voltage to the plurality of voltage-actuated switches, a control unit coupled to the voltage source, and a plurality of transmission lines coupled to the plurality of voltage-actuated switches and to the control unit and configured to provide an actuation signal from the voltage source to the plurality of voltage-actuated switches. The plurality of transmission lines being free of discrete resistive elements and having a substantially uniform resistivity such that an interaction between the plurality of transmission lines and the plurality of MR coil elements is minimized and thermal dissipation is distributed over a length of each of the plurality of transmission lines.

22 Claims, 2 Drawing Sheets

OTHER PUBLICATIONS

7102 Carbon Conductive Composition, Polymer Thick Film Composition, DuPont Microcircuit Materials, E.I. DuPont de Nemours and Company, 2001.
EeonTex Conductive Textiles, Eeonyx Corp.
Fibreohm Resistive Wire, Marktek Inc.
Innovative Technologies Conductive and Resistive Inks, Methode Electronics, Inc.
Hill et al., "Self-Assembled Polymer MEMS Sensors and Actuators," Proc. of SPIE, vol. 6172, 2006.
Netherlands Search Report dated Dec. 7, 2010 and Written Opinion with English Translation of Relevant Parts of Novelty Search Report.
Wiggins et al., "96-Channel Receive-Only Head Coil for 3 Tesla: Design Optimization and Evaluation", Magnetic Resonance in Medicine, vol. 62, pp. 754-762, 2009.
Wargo et al., "Fourt Channel Array for 9.4T Animal Studies", Proc. Intl. Soc. Mag. Reson. Med., vol. 16, p. 1102, 2008.
Joensuu, An Array RF Coil for Rabbit Thoracic Arteries Imaging at 200MHz, Proc. Intl. Soc. Mag. Reson. Med., vol. 17, p. 4736, 2009.

* cited by examiner

SYSTEM AND METHOD FOR MAGNETIC RESONANCE COIL ACTUATION

BACKGROUND OF THE INVENTION

Embodiments of the invention relate generally to a system and method for actuating magnetic resonance (MR) coil elements and, more particularly, to a system and method for selectively activating and deactivating MR coil elements.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization," $M_z$, may be rotated, or "tipped," into the x-y plane to produce a net transverse magnetic moment $M_t$. A signal is emitted by the excited spins after the excitation signal $B_1$ is terminated and this signal may be received and processed to form an image.

An MR imaging apparatus typically includes a number of transmission coils and a number of receiving or reception coils to generate and receive the emitted signals. Generally, the radio-frequency transmission coil transmits at the Larmor frequency, resulting in an echo signal that is received by a reception coil and digitized and processed to reconstruct the image using one of many well known reconstruction techniques. The reception coil is tuned to the Larmor frequency, allowing the reception coil to receive the echo signal. Because the reception coil is tuned to the Larmor frequency, the reception coil must be detuned during the transmission phase to prevent unwanted current from being induced within the reception coil from the transmitted magnetic field.

A detuning circuit, typically including a PIN diode, deactivates (i.e., detunes) the reception coil during operation of the transmission coil. The PIN diode is triggered via a current signal sent through a high-conductivity trace (typically silver or copper) from a drive unit to the PIN diode. Resistive elements, for example, discrete inductors and/or resistor and capacitor networks, are typically positioned along the length of the trace to dissipate the heat generated within the trace due to the large magnetic fields present in the MR environment. However, resistive elements increase the cost and design complexity of the detuning circuits. Further, hot spots may result at the locations where the discrete resistive elements are positioned on the traces that may lead to premature equipment failure or patient discomfort.

It is therefore desirable to provide a system and method for activating and deactivating an MR receiver coil element that minimizes the 'hot spots' caused by discrete power dissipation methods and decreases the cost and design complexity of an MR receiver coil apparatus.

BRIEF DESCRIPTION OF THE INVENTION

In accordance with one aspect of the invention, an apparatus includes a plurality of magnetic resonance (MR) coil elements and a plurality of voltage-actuated switches coupled to the plurality of MR coil elements, each voltage-actuated switch configured to selectively activate a respective MR coil element. The apparatus also includes a voltage source configured to supply a voltage to the plurality of voltage-actuated switches, a control unit coupled to the voltage source, and a plurality of transmission lines coupled to the plurality of voltage-actuated switches and to the control unit and configured to provide an actuation signal from the voltage source to the plurality of voltage-actuated switches. The plurality of transmission lines are free of discrete resistive elements and have a substantially uniform resistivity such that an interaction between the plurality of transmission lines and the plurality of MR coil elements is minimized and thermal dissipation is distributed over a length of each of the plurality of transmission lines.

In accordance with another aspect of the invention, a magnetic resonance (MR) system includes a magnetic resonance imaging (MRI) apparatus having a plurality of gradient coils positioned about a core of a magnet to impress a polarizing magnetic field and an RF transceiver system and an RF switch controlled by a pulse module to transmit RF signals to a MR coil assembly to acquire MR images. The MR coil assembly includes a plurality of MR receiver coils, a plurality of voltage-actuated switches coupled to the plurality of MR receiver coils, and a voltage source configured to supply a voltage to the plurality of voltage-actuated switches. The MR coil assembly also includes a driver configured to selectively activate the plurality of voltage-actuated switches via a voltage signal and a plurality of low-conductivity resistive traces free of discrete resistors. The plurality of low-conductivity resistive traces are coupled to the plurality of voltage-actuated switches and to the driver. The plurality of low-conductivity resistive traces are configured to transmit the voltage signal from the driver to the plurality of voltage-actuated switches.

In accordance with another aspect of the invention, a method for manufacturing an apparatus includes providing a plurality of magnetic resonance (MR) coil elements, coupling a plurality of electrostatic switches to the plurality of MR coil elements, configuring the plurality of electrostatic switches to selectively actuate the plurality of MR coil elements when a voltage potential is applied thereto, and providing a control unit to drive the plurality of electrostatic switches. The method of manufacturing also includes coupling a voltage supply to the control unit, coupling a plurality of transmission lines between the control unit and the plurality of electrostatic switches, and configuring the plurality of transmission lines to substantially uniformly dissipate energy between the voltage source and the plurality of electrostatic switches without discrete resistors and to distribute thermal dissipation is over a length of each of the plurality of transmission lines.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE INVENTION

Figure 1:
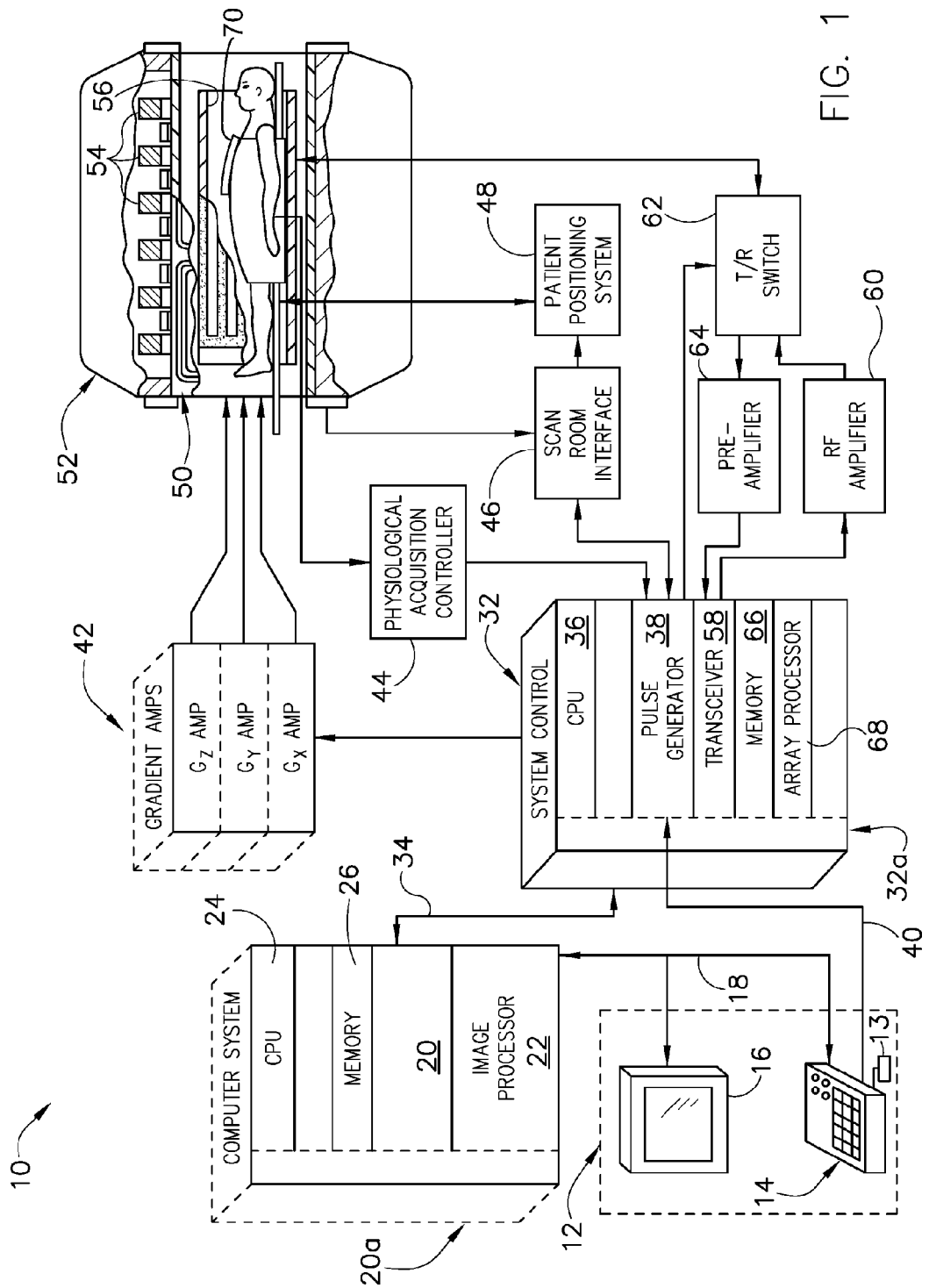
FIG. 1 is a schematic block diagram of an MR imaging system incorporating the invention.

Referring to FIG. 1, the major components of a preferred magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil 70) to be used in either the transmit or receive mode.

The MR signals picked up by RF coil 56 or surface coil 70 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
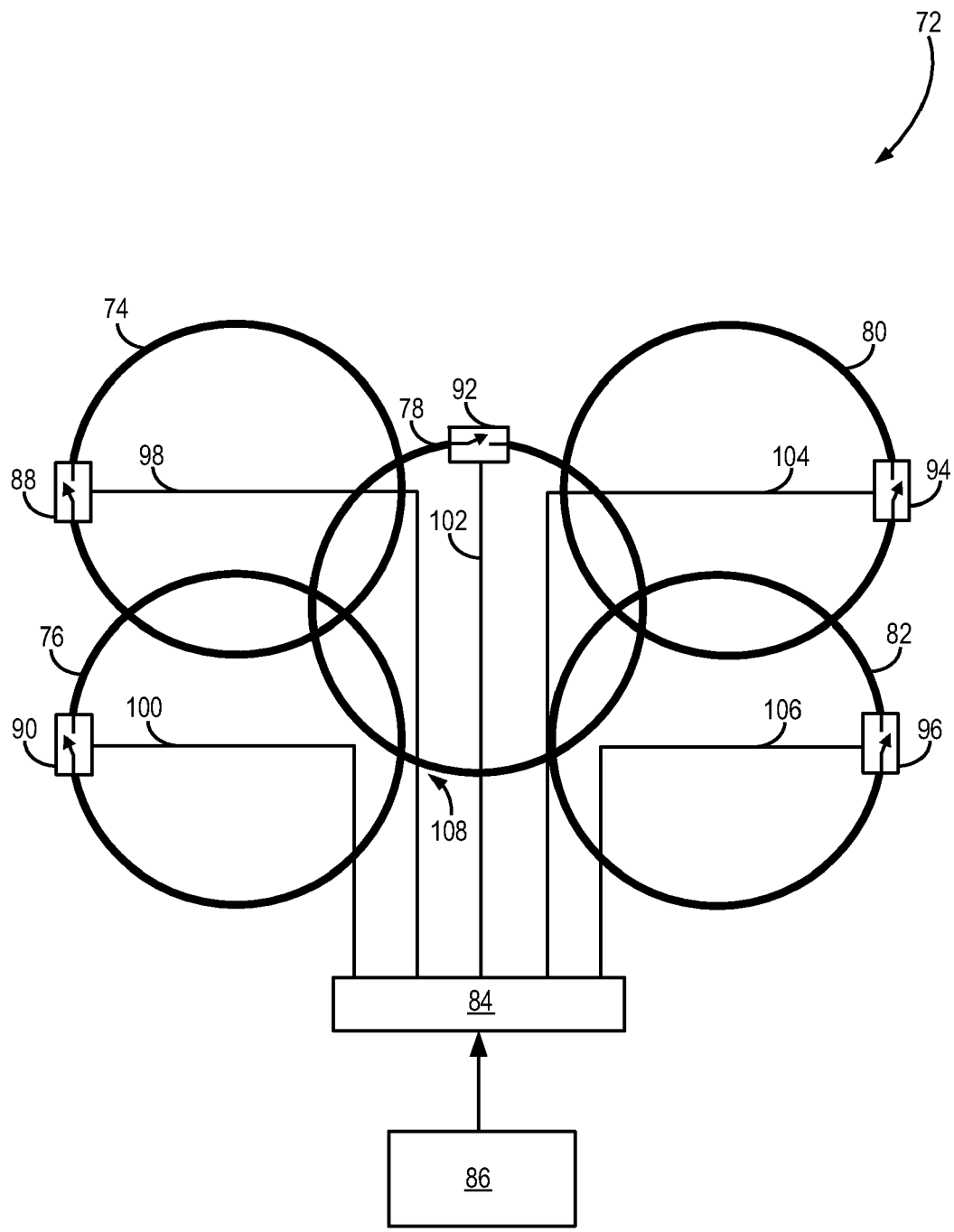
FIG. 2 is a schematic diagram of an MR coil element apparatus according to an embodiment of the invention.

Referring now to FIG. 2, a schematic diagram of an MR coil assembly 72 is shown, according to embodiments of the invention. MR coil assembly 72 includes a number of MR receiving coil elements 74, 76, 78, 80, 82. Each receiver element typically comprises a multiple active blocking network, a passive blocking network, a RF output attached to a low noise amplifier. According to one aspect of the invention, MR coil assembly 72 includes a control unit 84 comprising a totem-pole field-effect transistor (FET) array. A high-voltage power supply or power source 86, such as, for example, a 10V-100V piezoelectric power transformer, is coupled to control unit 84 and configured to deliver a control power thereto.

MR coil assembly 72 also includes an electrostatic or voltage-actuated switch 88, 90, 92, 94, 96 coupled to each MR receiving coil 74-82. According to one embodiment, switches 88-94 may be, for example, gallium nitride switches, FET devices, or microelectromechanical system (MEMS) devices that turn on and off based on a voltage potential, with little or no current applied thereto. Control unit 84 is configured to selectively drive switches 88-94.

In operation, control unit 84 uses transistor-transistor logic (TTL) controls to switch on and off individual MR coil elements 74-82 via electrostatic actuation of switches 88-96. Transmission lines or resistive traces 98, 100, 102, 104, 106 connect control unit 84 to respective MR receiving coil elements 74-82 and transmit a high voltage signal therebetween. Traces 98-106 are formed of a resistive material, for example, a low-conductivity ink or resistive ink having a resistivity of approximately 1-10 kOhm-in. Alternatively, resistive traces 98-106 may be constructed with an elastomer or polymer material that has conductive particles suspended within. Traces 98-106 may be patterned by stencil printing, silk screening, or ink jet printing, for example. Also, traces 98-106 may be patterned on a circuit board (not shown), eliminating the need for hard wiring between the control unit and switches. Alternatively, traces 98-106 may be patterned on a flexible substrate for use in wearable coils, for example. Traces 98-106 may also be constructed with a textile material (e.g., a fiber coated with a conducting polymer, a carbon fiber, or a resistive thread) having a surface resistivity of approximately 50-100 Ohms/sq/mil. According to another embodiment, traces 98-106 may comprise conductors having similar resistance per unit length interwoven with textiles, fabrics, polymer, plastic, and the like, to form flexible conformal circuits or flexible receiver coils, for example.

Unlike conventional high-conductivity traces (e.g., traces formed of copper or silver), which typically experience hot spots where discrete resistors are located on the traces, traces 98-106 have substantially uniform resistive properties throughout. Therefore, heat is dissipated substantially evenly along the entire length of traces 98-106 between control unit 84 and MR receiving coil elements 74-82. Further, traces 98-106 may be patterned having any desired path, length, and/or width. For example, the width of traces 98-106 may be manipulated to increase or decrease the surface area of the trace, based on desired cooling or power handling characteristics. According to one embodiment, traces 98-106 may have a width of approximately 100 mils and/or a thickness of approximately 5 mils.

The low-conductivity properties of traces 98-106 minimize the interaction between traces 98-106 and coil elements 74-82 at intersection points (e.g., intersection point 108).

Therefore, traces 98-106 may be routed to coil elements 74-82 in any fashion without causing a potential undesired interaction (i.e., induced current) between traces 98-106 and MR coil elements 74-82. Thus, traces 98-106 may be configured to overlap coil elements 74-82, as shown in FIG. 2. Additionally, the low conductive properties of traces 98-106 minimize the potential for external magnetic fields to induce current within traces 98-106.

Accordingly, embodiments of the invention provide an increased area for heat dissipation, as thermal energy is evenly distributed along the entire length of each trace 98-106. Thus, traces 98-106 substantially minimize or eliminate areas of highly concentrated heat dissipation or "hot spots" on MR coil elements 74-82, which typically result from discrete resistors positioned along a length of a trace. Further, because traces 98-106 may be constructed on a single-layer printed circuit board (PCB), embodiments of the invention allow for constructing traces 98-106 to allow for thinner, more flexible surface coils, which is highly desirable.

Therefore, in accordance with one embodiment, an apparatus includes a plurality of magnetic resonance (MR) coil elements and a plurality of voltage-actuated switches coupled to the plurality of MR coil elements, each voltage-actuated switch configured to selectively activate a respective MR coil element. The apparatus also includes a voltage source configured to supply a voltage to the plurality of voltage-actuated switches, a control unit coupled to the voltage source, and a plurality of transmission lines coupled to the plurality of voltage-actuated switches and to the control unit and configured to provide an actuation signal from the voltage source to the plurality of voltage-actuated switches. The plurality of transmission lines are free of discrete resistive elements and have a substantially uniform resistivity such that an interaction between the plurality of transmission lines and the plurality of MR coil elements is minimized and thermal dissipation is distributed over a length of each of the plurality of transmission lines.

In accordance with another embodiment, a magnetic resonance (MR) system includes a magnetic resonance imaging (MRI) apparatus having a plurality of gradient coils positioned about a core of a magnet to impress a polarizing magnetic field and an RF transceiver system and an RF switch controlled by a pulse module to transmit RF signals to a MR coil assembly to acquire MR images. The MR coil assembly includes a plurality of MR receiver coils, a plurality of voltage-actuated switches coupled to the plurality of MR receiver coils, and a voltage source configured to supply a voltage to the plurality of voltage-actuated switches. The MR coil assembly also includes a driver configured to selectively activate the plurality of voltage-actuated switches via a voltage signal and a plurality of low-conductivity resistive traces free of discrete resistors. The plurality of low-conductivity resistive traces are coupled to the plurality of voltage-actuated switches and to the driver. The plurality of low-conductivity resistive traces are configured to transmit the voltage signal from the driver to the plurality of voltage-actuated switches.

In accordance with yet another embodiment, a method for manufacturing an apparatus includes providing a plurality of magnetic resonance (MR) coil elements, coupling a plurality of electrostatic switches to the plurality of MR coil elements, configuring the plurality of electrostatic switches to selectively actuate the plurality of MR coil elements when a voltage potential is applied thereto, and providing a control unit to drive the plurality of electrostatic switches. The method of manufacturing also includes coupling a voltage supply to the control unit, coupling a plurality of transmission lines between the control unit and the plurality of electrostatic switches, and configuring the plurality of transmission lines to substantially uniformly dissipate energy between the voltage source and the plurality of electrostatic switches without discrete resistors and to distribute thermal dissipation is over a length of each of the plurality of transmission lines.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus comprising:
   a plurality of magnetic resonance (MR) coil elements;
   a plurality of voltage-actuated switches coupled to the plurality of MR coil elements, each voltage-actuated switch configured to selectively activate a respective MR coil element;
   a voltage source configured to supply a voltage to the plurality of voltage-actuated switches;
   a control unit coupled to the voltage source; and
   a plurality of transmission lines comprising a plurality of low-conductivity resistive traces free of discrete resistors coupled to the plurality of voltage-actuated switches and to the control unit and configured to provide an actuation signal from the voltage source to the plurality of voltage-actuated switches, the plurality of transmission lines being free of discrete resistive elements and having a substantially uniform resistivity such that an interaction between the plurality of transmission lines and the plurality of MR coil elements is minimized and thermal dissipation is distributed over a length of each of the plurality of transmission lines.

2. The apparatus of claim 1 wherein the plurality of transmission lines are configured to overlap the plurality of MR coil elements.

3. The apparatus of claim 1 wherein the plurality of transmission lines are free of discrete inductors.

4. The apparatus of claim 1 wherein the plurality of transmission lines further comprise a resistive ink.

5. The apparatus of claim 1 wherein the plurality of transmission lines further comprise a polymer material having conductive particles suspended therein.

6. The apparatus of claim 1 wherein the plurality of transmission lines further comprise a material having a resistivity between approximately 1 kOhm/in and approximately 10 kOhm/in.

7. The apparatus of claim 1 wherein the voltage-actuated switch comprises at least one of a microelectromechanical system (MEMS) device and a field-effect transistor (FET) switch.

8. The apparatus of claim 7 further comprising a totem-pole FET array disposed between the voltage source and the plurality of voltage-actuated switches and configured to selectively drive the MEMS device.

9. A magnetic resonance (MR) system comprising:
   a magnetic resonance imaging (MRI) apparatus having a plurality of gradient coils positioned about a core of a magnet to impress a polarizing magnetic field and an RF transceiver system and an RF switch controlled by a pulse module to transmit RF signals to a MR coil assembly to acquire MR images, wherein the MR coil assembly comprises:
a plurality of MR receiver coils;
a plurality of voltage-actuated switches coupled to the plurality of MR receiver coils;
a voltage source configured to supply a voltage to the plurality of voltage-actuated switches;
a driver configured to selectively activate the plurality of voltage-actuated switches via a voltage signal; and
a plurality of low-conductivity resistive traces free of discrete resistors and coupled to the plurality of voltage-actuated switches and to the driver, the plurality of low-conductivity resistive traces configured to transmit the voltage signal from the driver to the plurality of voltage-actuated switches.

10. The system of claim 9 wherein the plurality of voltage-actuated switches comprise one of a microelectromechanical system (MEMS) device and a field-effect transistor (FET); and
wherein the driver comprises a totem-pole FET array configured to selectively drive the MEMS devices.

11. The system of claim 9 wherein the plurality of low-conductivity resistive traces further comprise one of a polymer having conductive particles suspended therein and a conductive ink.

12. The system of claim 9 wherein the plurality of low-conductivity resistive traces further comprise one of a resistive wire, a carbon fiber, and a resistive thread.

13. The apparatus of claim 9 wherein the plurality of low-conductivity resistive traces further comprise a material having a resistivity between approximately 1 kOhm/in and approximately 5 kOhm/in.

14. A method for manufacturing an apparatus comprising:
providing a plurality of magnetic resonance (MR) coil elements;
coupling a plurality of electrostatic switches to the plurality of MR coil elements;
configuring the plurality of electrostatic switches to selectively actuate the plurality of MR coil elements when a voltage potential is applied thereto;
providing a control unit to drive the plurality of electrostatic switches;
coupling a voltage supply to the control unit;
coupling a plurality of transmission lines between the control unit and the plurality of electrostatic switches; and
configuring the plurality of transmission lines to substantially uniformly dissipate energy between the voltage source and the plurality of electrostatic switches without discrete resistors and to distribute thermal dissipation is over a length of each of the plurality of transmission lines.

15. The method of claim 14 further comprising providing a field-effect transistor (FET) array to drive the plurality of voltage-actuated switches.

16. The method of claim 15 wherein coupling the plurality of electrostatic switches comprises coupling one of a plurality of microelectromechanical system (MEMS) devices and a plurality of FETs to the plurality of MR coil elements.

17. The method of claim 16 further comprising configuring the FET array to independently drive each of the plurality of MEMS devices.

18. The method of claim 14 further comprising configuring the plurality of transmission lines to overlap the plurality of MR coil elements while minimizing interaction between the plurality of transmission lines and the plurality of MR coil elements.

19. The method of claim 14 further comprising forming the plurality of transmission lines via one of stencil printing, silk screening, and ink jet printing.

20. The method of claim 14 further comprising interweaving a plurality of conductors with at least one of textiles, fabrics, polymers, and plastics to form a plurality of flexible conformal circuits.

21. The method of claim 14 further comprising selecting a width of the plurality of transmission lines corresponding to a desired power handling characteristic.

22. The method of claim 21 comprising selecting a width of the plurality of transmission lines of approximately 100 mils.

* * * * *